US006483142B1

(12) United States Patent
Hsue et al.

(10) Patent No.: US 6,483,142 B1
(45) Date of Patent: Nov. 19, 2002

(54) DUAL DAMASCENE STRUCTURE HAVING CAPACITORS

(75) Inventors: Chen-Chiu Hsue, Hsinchu (TW); Shyh-Dar Lee, Hsinchu Hsien (TW)

(73) Assignee: Silicon Integrated Systems Corp., Hsin Chu (TW)

( * ) Notice: Subject to any disclaimer, the term of this patent is extended or adjusted under 35 U.S.C. 154(b) by 0 days.

(21) Appl. No.: 10/108,611

(22) Filed: Mar. 27, 2002

Related U.S. Application Data

(63) Continuation-in-part of application No. 09/854,872, filed on May 14, 2001, now Pat. No. 6,391,713.

(51) Int. Cl.[7] .......... H01L 21/8242

(52) U.S. Cl. .......... 257/306; 257/762

(58) Field of Search .......... 257/306–311, 762

(56) References Cited

U.S. PATENT DOCUMENTS

| | | | | |
|---|---|---|---|---|
| 5,808,855 A | * | 9/1998 | Chan et al. | 257/301 |
| 6,159,839 A | | 12/2000 | Jeng et al. | 438/618 |
| 6,180,976 B1 | | 1/2001 | Roy | 257/306 |

* cited by examiner

*Primary Examiner*—Jey Tsai
(74) *Attorney, Agent, or Firm*—Darby & Darby

(57) ABSTRACT

This invention provides a dual damascene structure having capacitors. Before the thin-film capacitor is formed, the underlie interconnections are fabricated with Cu metal by damascene processes. The capacitor is formed by depositing a first metal layer, an insulator and a second metal layer. Then, the stacked layers are subjected to two masking and etching processes to form the thin-film capacitor and the metal wire. After forming the capacitor, the upper interconnections are fabricated with Cu metal by damascene processes.

12 Claims, 9 Drawing Sheets

DUAL DAMASCENE STRUCTURE HAVING CAPACITORS

This application is a continuation-in-part of U.S. application Ser. No. 09/854,872, U.S. Pat. No. 6,391,213 filed May 14, 2001, now allowed.

BACKGROUND OF THE INVENTION

1. Field of the Invention

The present invention relates in general to an integrated circuit including capacitors. In particular, the present invention relates to a damascene structure of capacitors having uniform thickness of insulators.

2. Description of the Related Art

Capacitors are integrated in various integrated circuits. For example, capacitors can be used as decoupling capacitors to provide improved voltage regulation and noise immunity for power distribution. These capacitors also have wide applications in analog/logic, analog-to-digital, mixed signal, radio frequency circuits and so on.

A conventional method of manufacturing a semiconductor apparatus including a capacitor 20 that is formed of metal-insulator-metal layers is described with reference to FIGS. 1A~1D. As shown in FIG. 1A, an aluminum layer is deposited on an insulator 12 which contains interconnections and is formed on a silicon substrate having devices (not shown) thereon and therein. The aluminum layer is then patterned by masking and etching to form wires 14*a* and 14*b*. As shown in FIG. 1B, an insulator 16 with a tungsten plug 18 (hereafter are referred to W-plug) for connecting the aluminum wire 14*a* and to-be-formed capacitor is formed on the aluminum wires 14*a* and 14*b* and the insulator 12. As shown in FIG. 1C, a first conductive plate 21, an insulator 22 and a second conductive plate 23 are sequentially deposited on the insulator 16 and the W-plug 18, and then patterned by masking and etching to constitute a capacitor 20. The first conductive plate 21, which is used as the bottom electrode, is connected with the aluminum wire 14*a* through the W-plug 18. Another insulator 26 is deposited on the insulator 16 and the capacitor 20. The insulators 16 and 26 are patterned to form W-plug 28*a* and W-plug 28*b*. As shown in FIG. 1D, an aluminum layer (not shown) is deposited on the insulator 26 and the W-plugs 28*a* and 28*b*. The aluminum layer is then patterned by masking and etching to form wires 34*a* and 34*b*. The aluminum wire 34*a* is connected with the second conductive plate 23 through the W-plug 28*a*. The aluminum wire 34*b* is connected with the aluminum wire 14*b* through the W-plug 28*b*.

The above-mentioned method for integrating the capacitor 20 into the integrated circuits is not cost-effective enough because it requires several masking steps to form the capacitor 20.

With the enhancements of the integration and the highly demanding speed of data transmission, the aluminum interconnections cannot satisfy these trends. Copper (Cu) has high electric conductivity to reduce RC delay and can be substituted for the aluminum as conducting wires. Using copper as the conducting wires need additional processes, that is, damascene processes. During the etching process using chlorine plasma, the boiling point of copper chloride ($CuCl_2$) produced by copper and chlorine can reach temperature as high as 1500° C., so copper cannot be patterned by conventional etching process.

A thin-film capacitor formed by combining with the Cu damascene processes is disclosed in U.S. Pat. No. 6,180,976 B1. In the '976 B1 patent, the bottom electrode of the thin-film capacitor is also formed by the damascene process. The '976 B1 patent has advantage of saving a masking step. However, a chemical mechanical polishing process is required to remove the undesirable metal material to form the bottom electrode. The dishing phenomenon is likely to occur on the bottom electrode and result in uneven surface. Therefore, the thickness of the insulator can not be controlled to be unvaried and uniform, thereby to stabilize the electrical properties of the capacitors.

SUMMARY OF THE INVENTION

It is an object of the present invention to provide an improved method of forming a damascene structure having capacitors.

It is another object of the present invention to provide a method of forming a damascene structure having capacitors, which uses relatively fewer masking steps.

The present invention provides a dual damascene structure having capacitors. A first Cu wire and a second Cu wire are located in a first insulator. A first sealing layer is located on the first insulator and the first and the second Cu wires. A second insulator is located on the first sealing layer. A third insulator is located on the second insulator. A first Cu plug and a second Cu plug are located in the first sealing layer, the second insulator and the third insulator. A bottom electrode is located on the third insulator and the first Cu plug, wherein the bottom electrode is connected to the first Cu wire through the first Cu plug. A conducting wire is located on the third insulator and the second Cu plug, wherein the conducting wire is connected to the second Cu wire through the second Cu plug. A fourth insulator is located on the bottom electrode and the conducting wire. An upper electrode is located on the fourth insulator, and corresponding to the bottom electrode. A fifth insulator with a flat surface is located on the upper electrode, the fourth insulator and the third insulator. A first dual damascene structure and a second dual damascene structure are located in the fifth insulator and the fourth insulator, the first dual damascene structure comprising a third Cu wire and a third Cu plug, the second dual damascene structure comprising a fourth Cu wire and a fourth Cu plug, wherein the upper electrode is connected to the third Cu wire through the third Cu plug, and the conducting wire is connected to the fourth Cu wire through the fourth Cu plug. A second sealing layer is located on the third and fourth Cu wires and the fifth insulator.

BRIEF DESCRIPTION OF THE DRAWINGS

The present invention will become more fully understood from the detailed description given herein and the accompanying drawings, given by way of illustration only and thus not intended to be limitative of the present invention.

DETAILED DESCRIPTION OF THE PREFERRED EMBODIMENT

The present invention provides a method to fabricate a thin-film capacitor which can be integrated into the Cu damascene processes. The thin-film capacitor has an insulator with a uniform thickness and a flat surface. Before the thin-film capacitor is formed, the underlie interconnections are fabricated with Cu metal by damascene processes. The capacitor is formed by depositing a first metal layer, an insulator and a second metal layer. Then, the stacked layers are subjected to two masking and etching processes to form the thin-film capacitor and the metal wire. After forming the capacitor, the upper interconnections are fabricated with Cu metal by damascene processes.

Figure 1A:
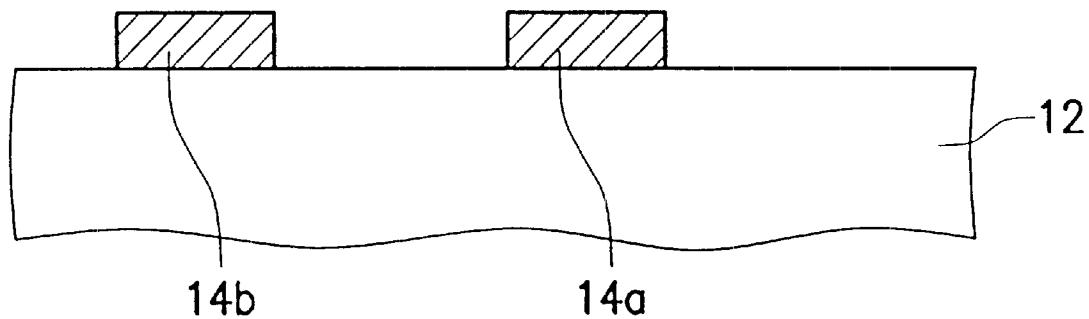
FIGS. 1A~1D depict the method for integrating the capacitors into the interconnection processes according to the prior art.
Figure 1B:
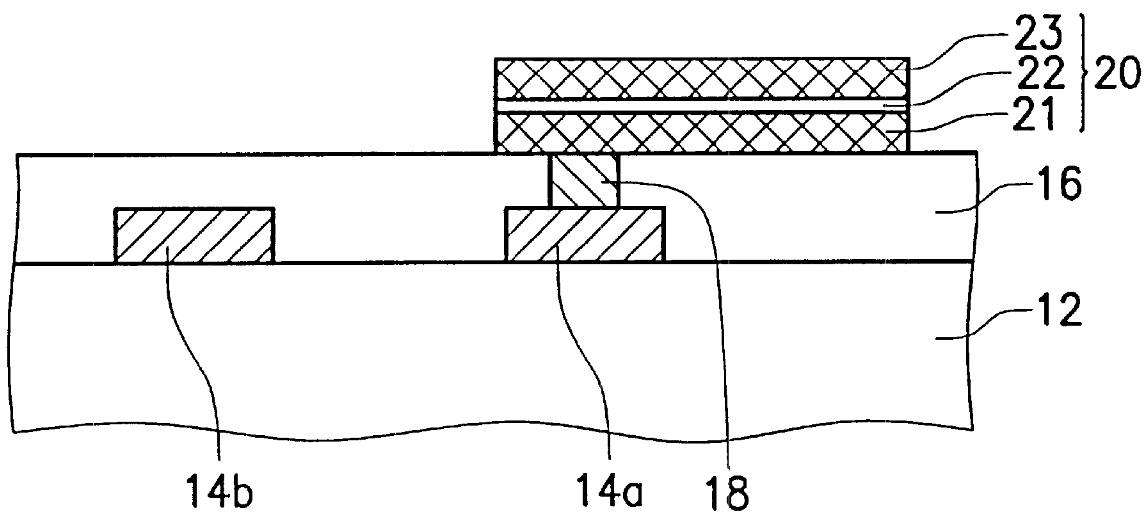
Figure 1C:
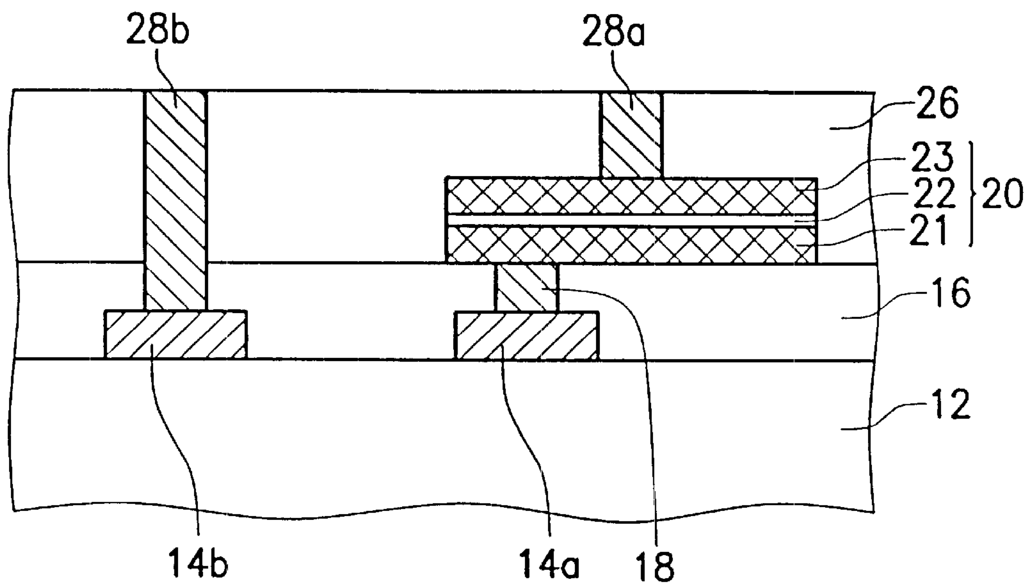
Figure 1D:
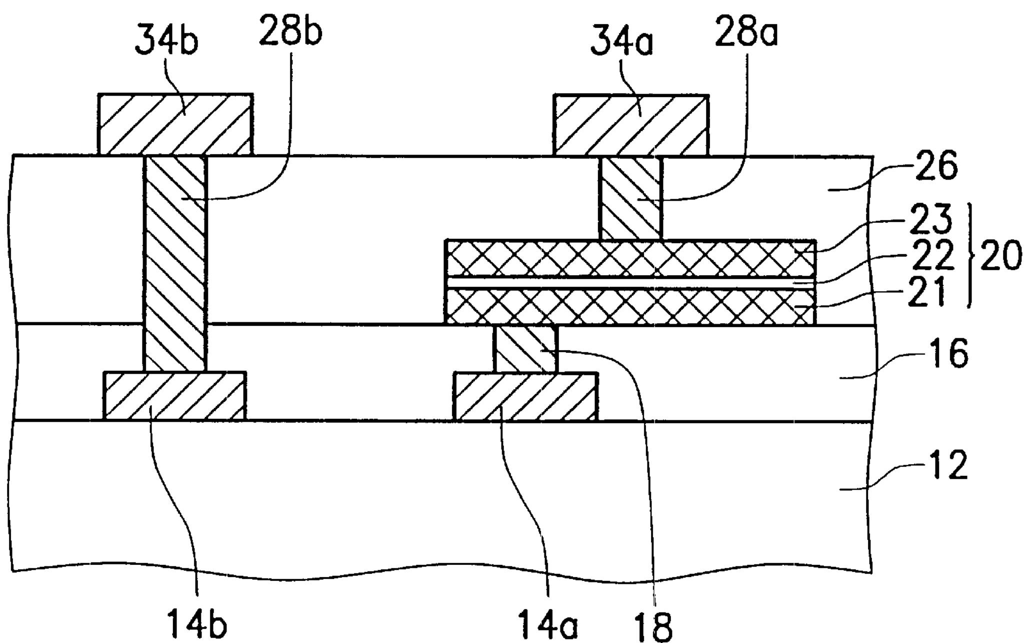
Figure 2A:
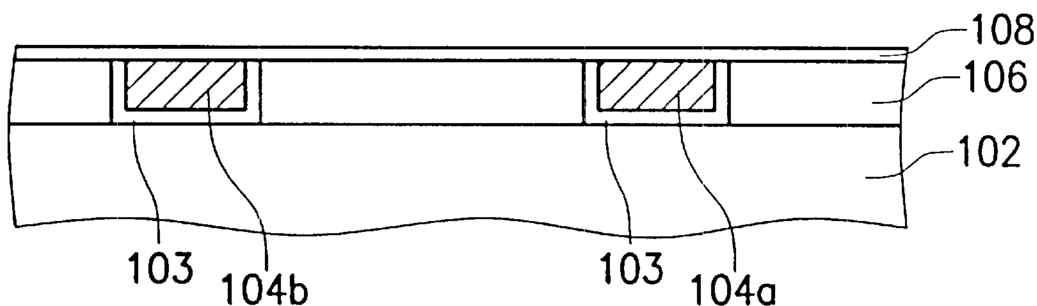
FIGS. 2A~2I depict the method for forming metal capacitors with uniform thickness of insulators by combining with damascene processes according to the first embodiment of the present invention.
Figure 2B:
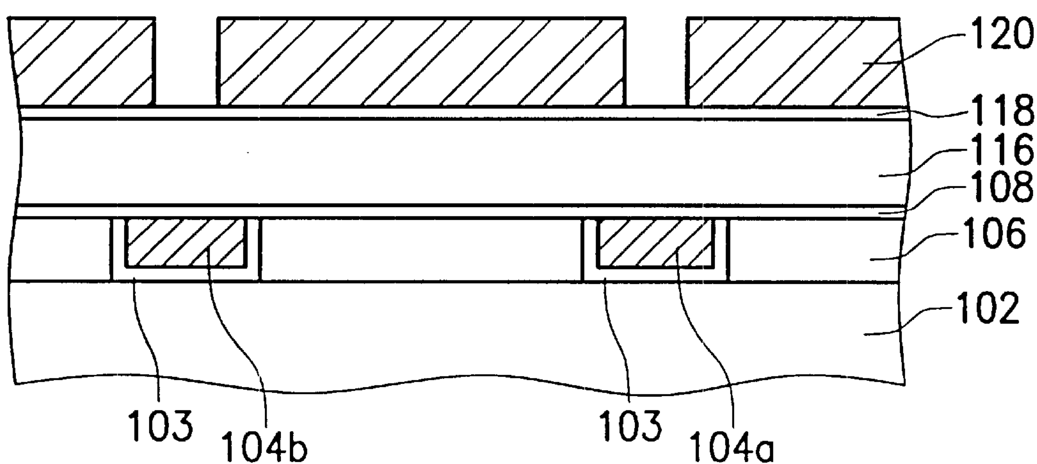
Figure 2C:
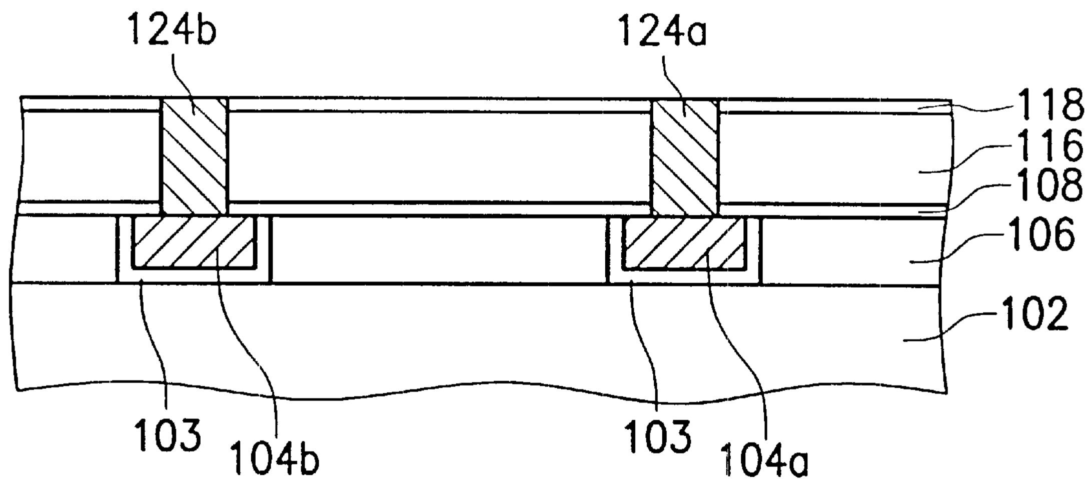
Figure 2D:
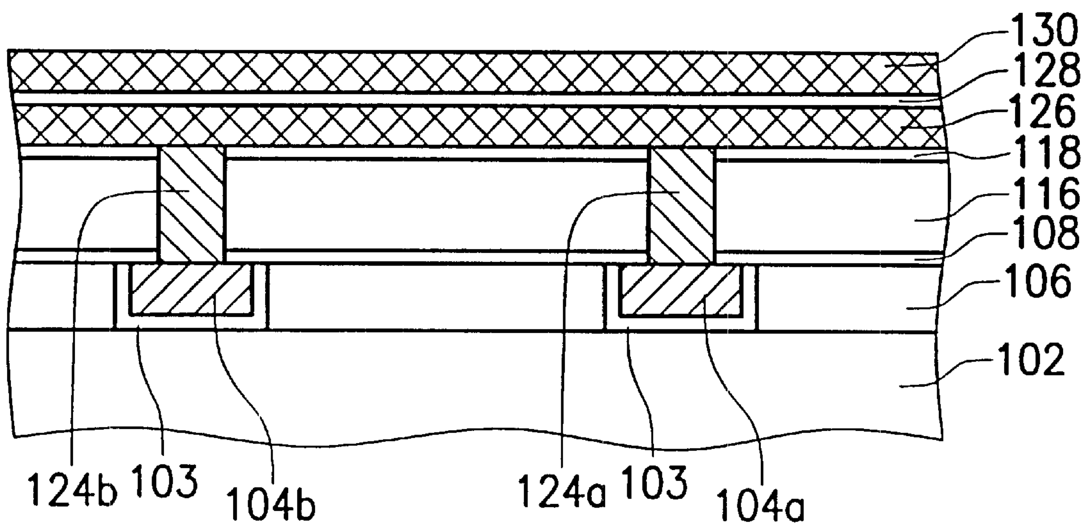
Figure 2E:
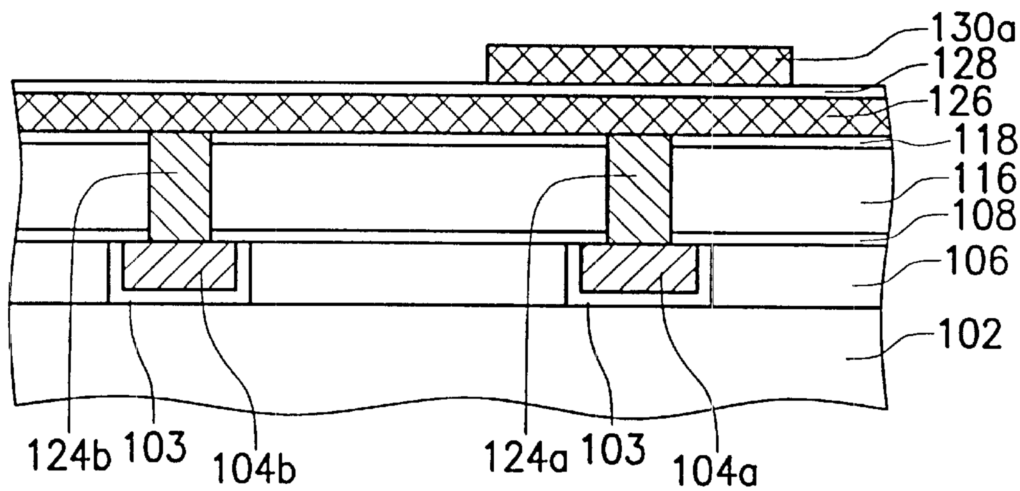
Figure 2F:
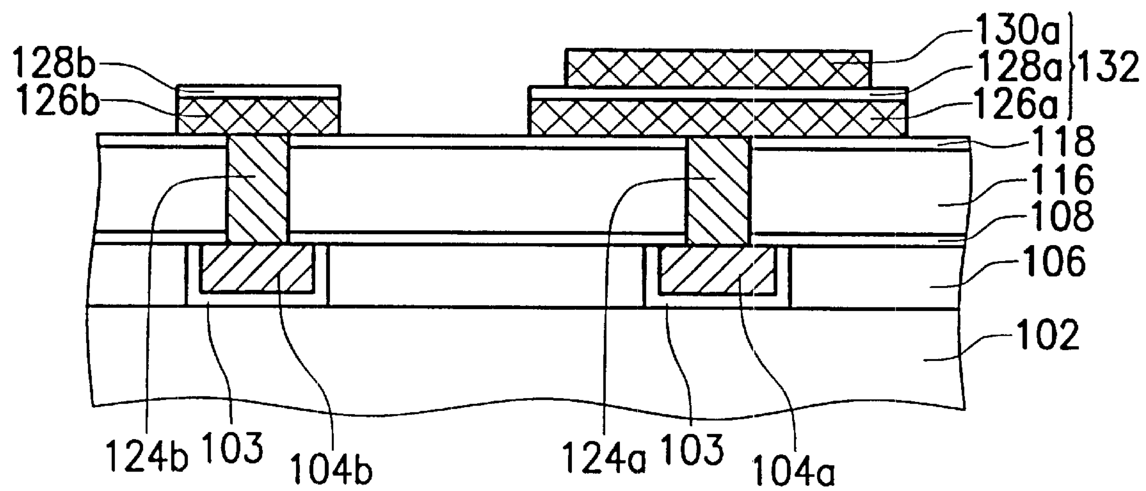
Figure 2G:
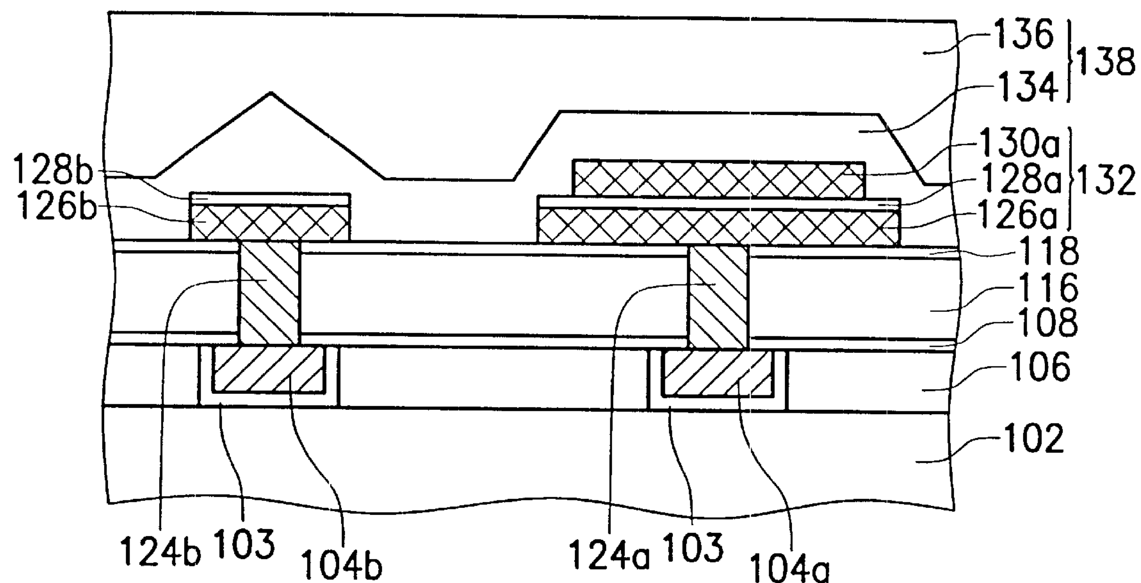
Figure 2H:
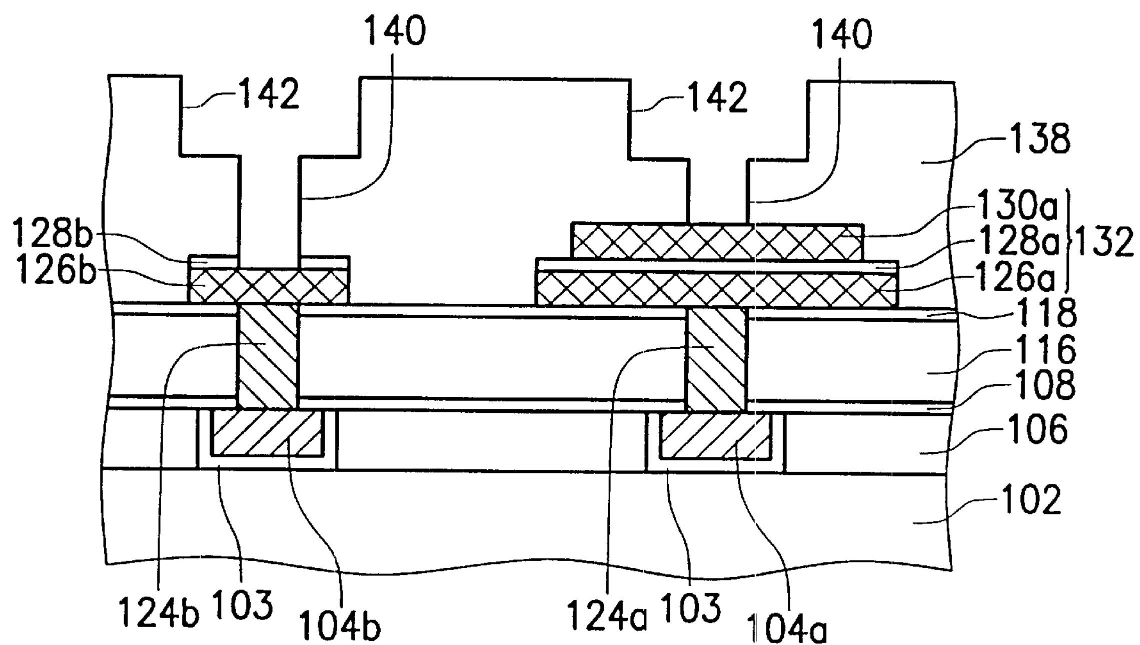
Figure 2I:
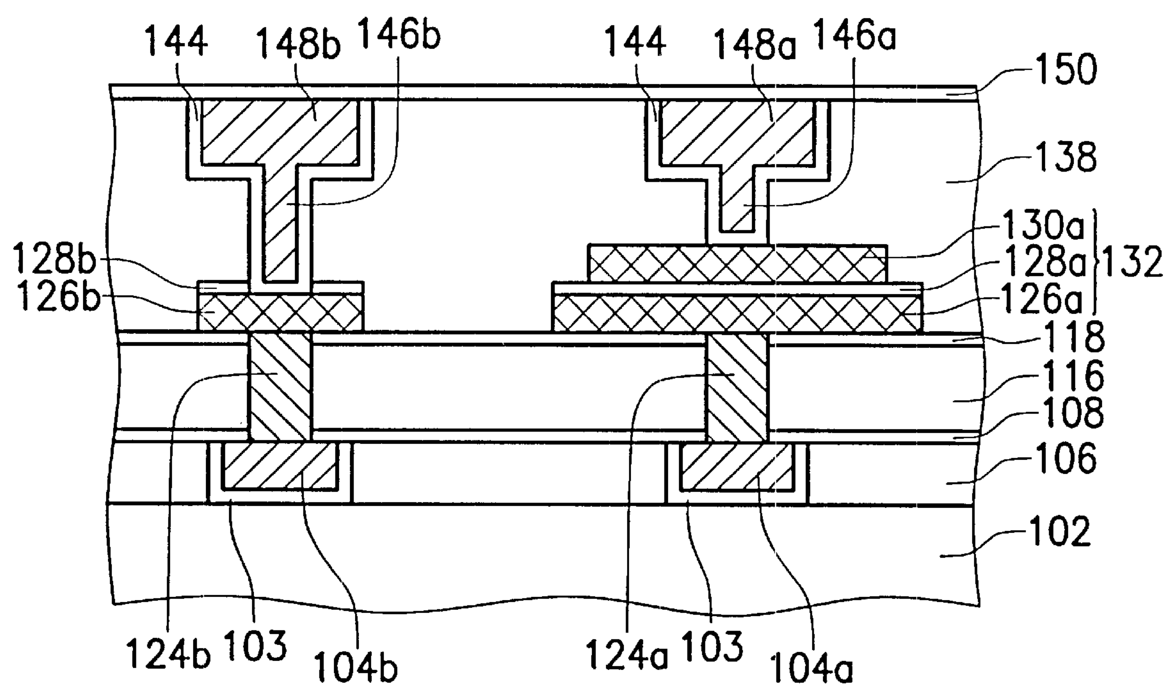

The present invention provides a dual damascene structure having capacitors, as shown in FIG. 2I. A first Cu wire 104*a* and a second Cu wire 104*b* are located in a first insulator 106. A first sealing layer 108 is located on the first insulator 106, the first Cu wire 104*a* and the second Cu wire 104*b*. A second insulator 116 is located on the first sealing layer 108. A third insulator 118 is located on the second insulator 116. A first Cu plug 124*a* and a second Cu plug 124*b* are located in the first sealing layer 108, the second insulator 116 and the third insulator 118. A bottom electrode 126*a* is located on the third insulator 118 and the first Cu plug 124*a,* wherein the bottom electrode 126*a* is connected to the first Cu wire 104*a* through the first Cu plug 124*a*. A conducting wire 126*b* is located on the third insulator 118 and the second Cu plug 124*b,* wherein the conducting wire 126*b* is connected to the second Cu wire 104*b* through the second Cu plug 124*b*. A fourth insulator 128*a* and 128*b* is located on the bottom electrode 126*a* and the conducting wire 126*b,* respectively. An upper electrode 130*a* is located on the fourth insulator 128*a,* and corresponding to the bottom electrode 126*a*. A fifth insulator 138 with a flat surface is located on the upper electrode 130*a,* the fourth insulator 128*a* and 128*b* and the third insulator 118. A first dual damascene structure and a second dual damascene structure are located in the fifth insulator 138 and the fourth insulator 118, the first dual damascene structure comprising a third Cu wire 148*a* and a third Cu plug 146*a,* the second dual damascene structure comprising a fourth Cu wire 148*b* and a fourth Cu plug 146*b,* wherein the upper electrode 130*a* is connected to the third Cu wire 148*a* through the third Cu plug 146*a,* and the conducting wire 126*b* is connected to the fourth Cu wire 148*b* through the fourth Cu plug 146*b*. A second sealing layer 150 is located on the third Cu wire 148*a,* the fourth Cu wire 148*b* and the fifth insulator 138.

The methods for forming the above-mentioned dual damascene structure having capacitors are given in the following first and second embodiments.

First Embodiment

FIGS. 2A~2I depict the method for forming metal capacitors with uniform thickness of insulators by combining with damascene processes according to the first embodiment of the present invention.

Referring to FIG. 2A, the insulator 106 is formed on the insulator 102. The insulator 102 may include interconnections, and the insulator 102 is formed on a substrate, such as silicon semiconductor substrate, which include numerous devices thereon and therein. Those particular designs of the underlying integrated circuit have not been shown in order to more clearly describe and show the aspects of the present invention. Copper wires 104*a* and 104*b,* preferably about 2,000 Å~6,000 Å, are formed in the insulator 106 by a damascene process. For example, firstly, trenches are formed in the insulator 106, and the barrier layer 103 is conformally formed on the insulator 106. After copper metal is formed on the barrier layer 103 and filled in the trenched, a chemical mechanical polish process is executed to remove the undesirable copper and barrier layer 103. A sealing layer 108, preferably about 100 Å~400 Å in thickness, is formed at least on the Cu wires 104*a* and 104*b*. The material of the sealing layer 108 can be silicon nitride or silicon carbide.

Referring to FIG. 2B, the insulator 116 and the insulator layer 118 which is acted as an etch stop layer are sequentially formed on the insulator 106 and the Cu wires 104*a* and 104*b*. The material of the insulator layer 118, such as silicon nitride (SiN), is different from that of the insulator 116, such as silicon dioxide ($SiO_2$). The photoresist layer 120 with via patterns is covered on the stop layer 118.

Referring to FIG. 2C, the via patterns of the photoresist layer 120 are transferred into the insulator 118, the insulator 116 and the sealing layer 108 to form vias exposed the contact regions of the Cu wires 104*a* and 104*b*. The photoresist layer 120 is then removed by, such as, a dry or wet process. The plugs 124*a* and 124*b* are formed in the vias by, such as, depositing a conformal barrier layer and a metal layer and polishing the undesirable portion with the planarization techniques, such as, a chemical mechanical polishing process. The plugs 124*a* and 124*b* can be Cu plugs or W plugs, preferably the former.

Referring to FIG. 2D, the metal layer 126, the insulator 128 and the metal layer 130 are formed on the insulator 118 and the plugs 124*a* and 124*b*. The metal layer 126, with a thickness ranging from about 300 Å to about 2,000 Å, is ready for forming the bottom electrode of the capacitor and conducting wires for a part of the interconnections. The insulator 128, with a thickness ranging from about 100 Å to about 1,200 Å, is ready for forming the capacitor, however, the particular thickness of this insulator 128 depends on a particular application of the capacitor with a desired capacitance. The metal layer 130, with a thickness ranging from about 200 Å to about 1,500 Å, is ready for forming the upper electrode of the capacitor. The material used to form the metal layer 130 can be titanium (Ti), titanium nitride (TiN), tantalum (Ta), tantalum nitride (TaN), aluminum (Al), aluminum copper alloy (AlCu), and the like. The material of the insulator 128 has a high dielectric constant, which can be silicon nitride (SiN), silicon oxynitride (SiON), silicon carbon (SiC), tantalum oxide (TaO), zirconium oxide (ZrO), hafnium oxide (HfO), aluminum oxide (AlO) or other high dielectric constant materials. The material used to form the metal layer 126 is a commonly used conductive material, such as aluminum (Al), aluminum copper alloy (AlCu), silver (Ag) or aurum (Au).

With Reference to FIG. 2E, the metal layer 130 is patterned to form the upper electrode 130*a* with a masking step and an etching step.

As shown in FIG. 2F, the insulator 128 and the metal layer 126 are patterned to form a conducting wire 126*b* and a bottom electrode 126*a* by proceeding another masking step and another etching step until the insulator 118 is exposed, wherein the insulator 118 acts as an etch stop layer. The insulator 128 is also transferred to an insulator 128*b* disposed on top of the conducting wire 126*b* and an insulator 128*a* disposed on top of the bottom electrode 126*a* after the masking and etching steps. The region of the bottom electrode 126*a* is substantially corresponding to that of the upper electrode 130*a*. The size of the bottom electrode 126*a* region is equal to or larger than that of the upper electrode 130*a*.

The conducting wire 126*b* is connected with the Cu wire 104*b* through the plug 124*b*.

A capacitor 132 is composed of the upper electrode 130*a,* the insulator 128*a* and the bottom electrode 126*a*. The bottom electrode 126*a* is connected with the Cu wire 104*a* through the plug 124*a*. The overlapped region between the upper electrode 130*a* and the bottom electrode 126*a* can produce capacitance effect. Therefore, the upper electrode 130*a* basically dominates the capacitance of the capacitor 132. When defining the upper electrode 130*a*, its area should be accurately controlled. In contrast, when defining the bottom electrode 126*a*, the process has relative high tolerance.

Compared to the U.S. Pat. No. 6,180,976 B1., the capacitor 132 of the present invention has a relatively uniform and even insulator 128*a*, because the bottom electrode 126*a* has a uniform and even surface formed by depositing and etching steps. Therefore, the capacitor 132 of the present invention can have better electrical properties.

Now turning to FIG. 2G, an insulator 134 with a good gap filling capability is covered on the insulator 118, insulators 128*a* and 128*b* and the upper electrode 130*a*. The insulator 134 is formed by high density plasma technology to deposit the silicon oxide, or by coating the silicon-on glass (SOG) or silicon-on polymer (SOP). A blanket, sacrificial insulator 136 is formed on the insulator 134. The blanket, sacrificial insulator 136 is then subjected to a planarization process, such as a chemical mechanical polishing process. Therefore, the insulator 136 has a planar surface to facilitate the subsequent processes. For the convenience of description, the insulator 134 and the insulator 136 are referred to an insulator 138 in the following figures and specification.

A dual damascene process is performed, as shown in FIGS. 2H and 2I. The dual damascene patterns including trenches 142 and vias 140 are formed in the insulator 138. The to-be-contact regions of the conducting wire 126*b* and the upper electrode 130*a* are exposed through the vias 140.

With Reference to FIG. 2I, a barrier layer 144 is conformally formed over the insulator 138, in the trenches 142 and vias 140. Cu metal is formed above the barrier layer 144 and filled in the trenches 142 and vias 140. A chemical mechanical polishing process is performed to remove the undesirable Cu metal and the barrier layer 144 to form Cu wires 148*a* and 148*b* and Cu plugs 146*a* and 146*b*. A sealing layer 150 is formed on the insulator 138 and the Cu wires 148*a* and 148*b*. The material used to fabricate the sealing layer 150 can be silicon nitride or silicon carbide, which are used to prevent the Cu atoms of the wires 148*a* and 148*b* from diffusion. The upper electrode 130*a* is connected with the Cu wire 148*a* through the Cu plug 146*a*, and the conductive wire 126*b* is connected with the Cu wire 148*b* through the Cu plug 146*b*.

The subsequent interconnection processes and Cu processes are performed to finish the whole interconnections.

The above-mentioned insulators 102, 106, 116, 134 and 136 can be formed by low dielectric constant (K) materials, such as doped or undoped silicon oxide, SOP low K material, such as FLARE®, Si4C®, PAE-II® and so on, and CVD low K material, such as breakdiamond™ (BD™), Coral™, Greendot™, Aurora™ and so on.

Second Embodiment

Figure 3A:
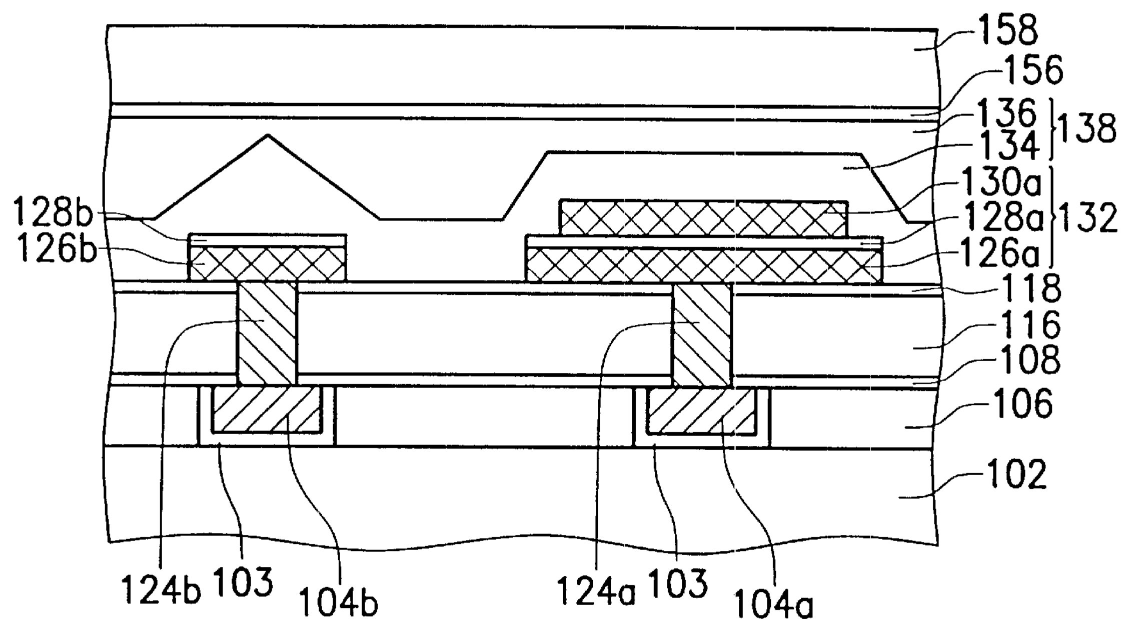
FIGS. 3A~3C depict the method for forming metal capacitors with uniform thickness of insulators by combining with another damascene processes according to the second embodiment of the present invention.
Figure 3B:
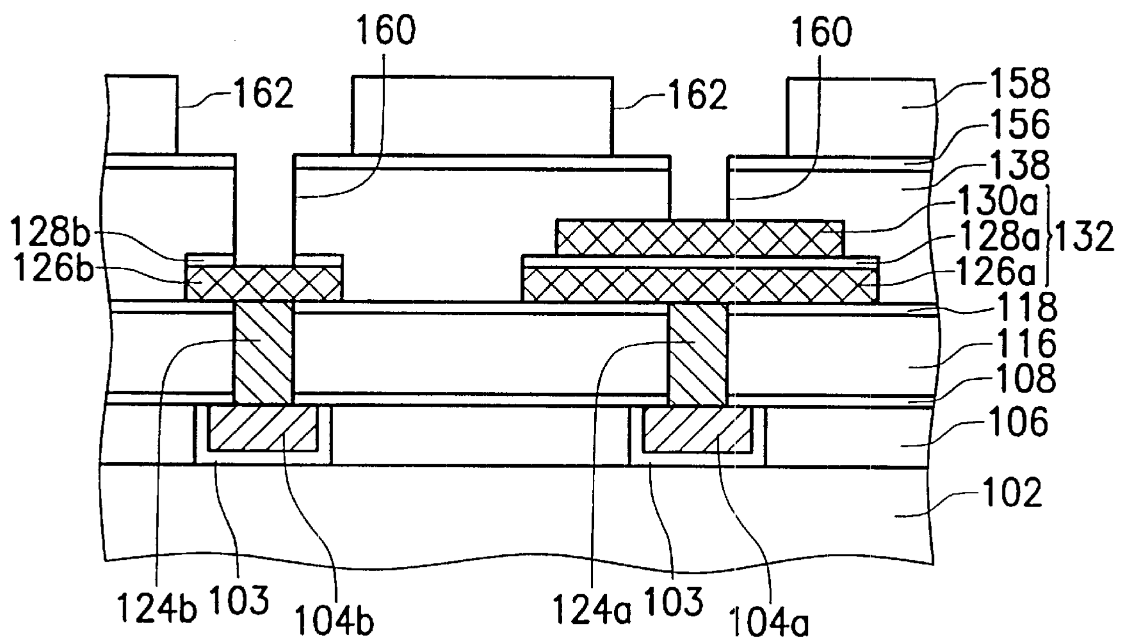
Figure 3C:
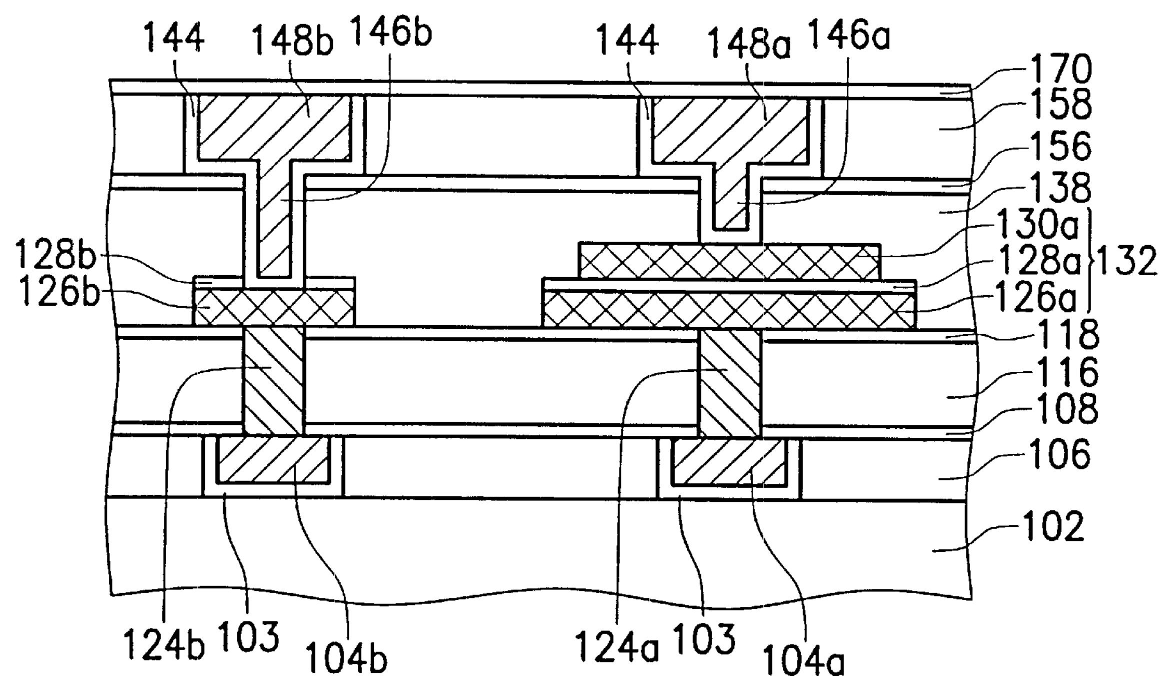

FIGS. 3A~3C depict the method for forming metal capacitors of uniform thickness by combining with another damascene processes according to the second embodiment of the present invention.

The method of forming the capacitor 132 with an uniform, flat insulator 128*a* and the conducting wire 126*b* is described in FIGS. 2A~2F.

After forming the capacitor 132, the upper interconnections are fabricated with Cu metal by another damascene process.

Now turning to FIG. 3A, an insulator 134 with a good gap filling capability is covered on the insulator 118, insulators 128*a* and 128*b* and the upper electrode 130*a*. The insulator 134 is formed by high density plasma to deposit the silicon oxide, or by coating the silicon-on glass (SOG) or silicon-on polymer (SOP). A blanket, sacrificial insulator 136 is formed on the insulator 134. The blanket, sacrificial insulator 136 is then subjected to a planarization process, such as a chemical mechanical polishing process. Therefore, the insulator 136 has a planar surface to facilitate the following process to carry out. For the convenience of description, the insulator 134 and the insulator 136 are referred to an insulator 138 in the following figures and specification. It should be noted that the total thickness of the insulator 138 is substantially equal to the height of the to-be-formed vias. Another thin insulator 156 with via patterns is disposed on the flat insulator 138 to be a hard mask. The material used to form the thin insulator 156 can be silicon nitride. A thick insulator 158 is formed on the thin insulator 156. The thickness of the insulator 158 is substantially equal to the height of the to-be-formed wires.

The dual damascene patterns are formed, as shown in FIG. 3B. The Dual damascene patterns including trenches 162 and vias 160 are formed in the insulator 158 and insulator 138, respectively. The to-be-contact regions of the conducting wire 126*b* and the upper electrode 130*a* are exposed through the vias 160.

With Reference to FIG. 3C, a barrier layer 144 is conformally formed on the insulators 158 and 138, in the trenches 162 and vias 160. Cu metal is formed above the barrier layer 144 and filled in the trenches 162 and vias 160. A chemical mechanical polishing process is performed to remove the undesirable Cu metal and the barrier layer 144 to form Cu wires 148*a* and 148*b* and Cu plugs 146*a* and 146*b*. A sealing layer 170 is formed on the insulator 158 and the Cu wires 148*a* and 148*b*.

The above-mentioned insulators 102, 106, 116, 134, 136 and 158 can be formed by low dielectric constant (K) materials, such as doped or undoped silicon oxide, SOP low K material, such as FLARE®, Si4C®, PAE-II® and so on, and CVD low K material, such as breakdiamond™ (BD™), Coral™, Greendot™, Aurora™ and so on.

Compared to the prior art showed in FIGS. 1A~1D, both of the Cu dual damascene processes and Al process are used in the present invention. Because the Cu dual damascene processes are introduced, the line width of the interconnections can be easily scaled down and the circuit performance can be improved. Moreover, when the bottom electrode is fabricated by masking and etching, the conductive wire is also fabricated at the same time. Thus, only an additional mask is required to form the upper electrode, thereby to reduce the fabrication cost.

Again, compared to the U.S. Pat. No. 6,180,976 B1., the insulator of the capacitor in the present invention has low variation in thickness.

While the present invention is described by preferred embodiments, it should be understood that the invention is not limited to these embodiments in any way. On the contrary, it is intended to cover all the modifications and arrangements as they would be apparent to those skilled in the art. Therefore, the scope of the appended claims should be interpreted in the broadest sense so as to encompass all the modifications and arrangements.

What is claimed is:

1. A dual damascene structure having capacitors, comprising:

a first Cu wire and a second Cu wire located in a first insulator;

a first sealing layer located on the first insulator and the first and the second Cu wires;

a second insulator located on the first sealing layer;

a third insulator located on the second insulator;

a first Cu plug and a second Cu plug located in the first sealing layer, the second insulator and the third insulator;

a bottom electrode located on the third insulator and the first Cu plug, wherein the bottom electrode is connected to the first Cu wire through the first Cu plug;

a conducting wire located on the third insulator and the second Cu plug, wherein the conducting wire is connected to the second Cu wire through the second Cu plug;

a fourth insulator located on the bottom electrode and the conducting wire;

an upper electrode located on the fourth insulator, and corresponding to the bottom electrode;

a fifth insulator with a flat surface located on the upper electrode, the fourth insulator and the third insulator;

a first dual damascene structure and a second dual damascene structure located in the fifth insulator and the fourth insulator, the first dual damascene structure comprising a third Cu wire and a third Cu plug, the second dual damascene structure comprising a fourth Cu wire and a fourth Cu plug, wherein the upper electrode is connected to the third Cu wire through the third Cu plug, and the conducting wire is connected to the fourth Cu wire through the fourth Cu plug; and a second sealing layer located on the third and fourth Cu wires and the fifth insulator.

2. The structure as claimed in claim 1, wherein the material of the bottom electrode and conducting wire is Al, AlCu, Cu, Ag, or Au.

3. The structure as claimed in claim 1, wherein the material of the fourth insulator is silicon nitride (SiN), silicon oxynitride (SiON), silicon carbide (SiC), tantalum oxide (TaO), zirconium oxide (ZrO), hafnium oxide (HfO), or aluminum oxide (AlO).

4. The structure as claimed in claim 1, wherein the material of the upper electrode is titanium (Ti), titanium nitride (TiN), tantalum (Ta), tantalum nitride (TaN), aluminum (Al), or aluminum copper alloy (AlCu).

5. The structure as claimed in claim 1, wherein the region of the bottom electrode is equal to that of the upper electrode.

6. The structure as claimed in claim 1, wherein the region of the bottom electrode is larger than that of the upper electrode.

7. The structure as claimed in claim 1, wherein the thickness of the upper electrode is ranging from 200 Å to 1,500 Å.

8. The structure as claimed in claim 1, wherein the thickness of the bottom electrode and that of the conducting wire are the same, and ranging from 300 Å to 2,000 Å.

9. The structure as claimed in claim 1, wherein the fifth insulator further comprises a hard mask therein.

10. The structure as claimed in claim 9, wherein the thickness of the fifth insulator above the hard mask is substantially equal to the height of the third and fourth Cu wires.

11. The structure as claimed in claim 9, wherein the thickness of the fifth insulator below the hard mask is substantially equal to the height of the third and fourth Cu plugs.

12. The structure as claimed in claim 9, wherein the material of the hard mask is silicon nitride.

* * * * *